United States Patent
Du et al.

(10) Patent No.: US 10,978,017 B2
(45) Date of Patent: Apr. 13, 2021

(54) SHIFT REGISTER UNIT, GATE DRIVING CIRCUIT, DISPLAY APPARATUS AND CONTROL METHOD

(71) Applicants: Hefei Xinsheng Optoelectronics Technology Co., Ltd., Hefei (CN); BOE Technology Group Co., Ltd., Beijing (CN)

(72) Inventors: Ruifang Du, Beijing (CN); Jiyan Ma, Beijing (CN); Xiaoye Ma, Beijing (CN); Rui Ma, Beijing (CN)

(73) Assignees: Hefei Xinsheng Optoelectronics Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/335,814

(22) PCT Filed: Jul. 19, 2018

(86) PCT No.: PCT/CN2018/096230
§ 371 (c)(1),
(2) Date: Mar. 22, 2019

(87) PCT Pub. No.: WO2019/062292
PCT Pub. Date: Apr. 4, 2019

(65) Prior Publication Data
US 2020/0090613 A1  Mar. 19, 2020

(30) Foreign Application Priority Data

Sep. 26, 2017 (CN) .......................... 201710881743.8

(51) Int. Cl.
*G09G 3/36* (2006.01)
*G11C 19/28* (2006.01)

(52) U.S. Cl.
CPC ........... *G09G 3/3677* (2013.01); *G11C 19/28* (2013.01); *G09G 2310/0286* (2013.01); *G09G 2310/08* (2013.01); *G09G 2330/04* (2013.01)

(58) Field of Classification Search
None
See application file for complete search history.

(56) References Cited

U.S. PATENT DOCUMENTS

| 8,155,261 B2 | 4/2012 | Hu |
| 8,860,652 B2 | 10/2014 | Yamashita |

(Continued)

FOREIGN PATENT DOCUMENTS

| CN | 101604551 A | 12/2009 |
| CN | 103632644 A | 3/2014 |

(Continued)

OTHER PUBLICATIONS

Nov. 28, 2019—(CN) First Office Action Appn No. 201710881743.8 with English Translation.

(Continued)

*Primary Examiner* — Stephen T. Reed
(74) *Attorney, Agent, or Firm* — Banner & Witcoff, Ltd.

(57) ABSTRACT

There is provided in the present disclosure a shift register unit, including: an input sub-circuit, whose first terminal is coupled to an input signal terminal, and second terminal is coupled to a pull-up node; an output sub-circuit, whose first terminal is coupled to the pull-up node, second terminal is coupled to a clock signal terminal, and third terminal is coupled to an output terminal, and configured to output a clock signal of the clock signal terminal to the output terminal under the control of a level signal of the pull-up node; a first electro-static discharge sub-circuit, whose first terminal is coupled to the pull-up node, second terminal is coupled to an electro-static discharge control terminal, and (Continued)

third terminal is coupled to a ground, and configured to discharge static electricity accumulated at the pull-up node under the control of a level signal of the electro-static discharge control terminal.

17 Claims, 13 Drawing Sheets

(56) References Cited

U.S. PATENT DOCUMENTS

| | | | | |
|---|---|---|---|---|
| 2008/0219401 A1* | 9/2008 | Tobita | ................... | G11C 19/28 377/79 |
| 2016/0063659 A1* | 3/2016 | Jangda | ................ | G09G 3/2092 345/522 |
| 2018/0182345 A1* | 6/2018 | Seong | ................ | G09G 3/3614 |

FOREIGN PATENT DOCUMENTS

| | | |
|---|---|---|
| CN | 204423875 U | 6/2015 |
| CN | 104966503 A | 10/2015 |
| CN | 105405387 A | 3/2016 |
| CN | 105489190 A | 4/2016 |
| CN | 105609138 A | 5/2016 |
| CN | 205282050 U | 6/2016 |
| CN | 105810251 A | 7/2016 |
| CN | 106504719 A | 3/2017 |
| CN | 106935206 A | 7/2017 |
| CN | 206331781 U | 7/2017 |

OTHER PUBLICATIONS

Oct. 17, 2018—(WO) International Search Report and Written Opinion application PCT/CN2018/096230 with English Translation.

* cited by examiner

US 10,978,017 B2

SHIFT REGISTER UNIT, GATE DRIVING CIRCUIT, DISPLAY APPARATUS AND CONTROL METHOD

CROSS-REFERENCE TO RELATED APPLICATION

The application is a U.S. National Phase Entry of International Application No. PCT/CN2018/096230 filed on Jul. 19, 2018, designating the United States of America and claiming priority to Chinese Patent Application No. 201710881743.8 filed on Sep. 26, 2017. The present application claims priority to and the benefit of the above-identified applications and the above-identified applications are incorporated by reference herein in their entirety.

TECHNICAL FIELD

The present disclosure relates to a shift register unit, a gate driving circuit comprising the shift register unit, and a control method applicable to the shift register unit.

BACKGROUND

As for a liquid crystal display (LCD) product, in its manufacturing and using process, prevention of static electricity is a very important work. Current gate driving circuit product performs static electricity prevention for signal lines in the product through an electro-static discharge (ESD) unit. However, in the manufacturing and using process of the product, there may also be a certain amount of charge accumulation inside the shift register unit (for example, at nodes PU and PD as described below). Charge accumulation over a long period of time would make thin film transistors in the shift register unit under a stress state, thereby resulting in that offset occurs to electrical characteristics of the thin film transistors, such that undesirable phenomena are caused.

SUMMARY

With respect to the above problem, there is provided in the present disclosure a new design of a shift register unit.

According to one aspect of the present disclosure, there is proposed a shift register unit, comprising: an input sub-circuit whose first terminal is coupled to an input signal terminal, second terminal is coupled to a pull-up node (PU); an output sub-circuit whose first terminal is coupled to the pull-up node (PU), second terminal is coupled to a clock signal terminal (CLK), and third terminal is coupled to an output terminal, and configured to output a clock signal of the clock signal terminal (CLK) to the output terminal under the control of a level signal of the pull-up node (PU); a first electro-static discharge sub-circuit whose first terminal is coupled to the pull-up node (PU), second terminal is coupled to an electro-static discharge control terminal (GND_start), and third terminal is coupled to a ground, and configured to discharge static electricity accumulated at the pull-up node (PU) under a control of a level signal of the electro-static discharge control terminal (GND_start).

In an embodiment, the shift register unit further comprises: a pull-down control sub-circuit whose first terminal is coupled to the pull-up node (PU), second terminal is coupled to a first power supply terminal (VDD1, VDD2), and third terminal is coupled to a second power supply terminal (LVSS), and configured to control a level of a pull-down node (PD1, PD2) according to a level of the pull-up node (PU), a first power supply signal input by the first power supply terminal (VDD1, VDD2) and a second power supply signal input by the second power supply terminal (LVSS); a pull-down sub-circuit whose first terminal is coupled to the pull-down node (PD1, PD2), second terminal is coupled to the pull-up node (PU), third terminal is coupled to the output terminal, and fourth terminal is coupled to the second power supply terminal (LVSS), and configured to pull down levels of the pull-up node (PU) and the output terminal to the second power supply signal of the second power supply terminal (LVSS) under a control of a level signal of the pull-down node (PD1, PD2); a reset sub-circuit, whose first terminal is coupled to a reset signal terminal (RST_PU), second terminal is coupled to the pull-up node (PU), and third terminal is coupled to the second power supply line (LVSS), and configured to pull down the pull-up node (PU) to the second power supply signal of the second power supply terminal (LVSS) under a control of a level signal of the reset signal terminal.

In an embodiment, the shift register unit further comprises: a second electro-static discharge sub-circuit, whose first terminal is coupled to the pull-down node (PD1, PD2), second terminal is coupled to the electro-static discharge control terminal (GND_start), and third terminal is coupled to a ground, and configured to discharge static electricity accumulated at the pull-down node (PD1, PD2) under the control of the level signal of the electro-static discharge control terminal (GND_start).

In an embodiment, the shift register unit further comprises: a third electro-static discharge sub-circuit, whose first terminal is coupled to the output terminal, second terminal is coupled to the electro-static discharge control terminal (GND_start), and third terminal is coupled to a ground, and configured to discharge static electricity accumulated at the output terminal under the control of the level signal of the electro-static discharge control terminal (GND_start).

In an embodiment, the first electro-static discharge sub-circuit comprises a first electro-static discharge transistor (M14), whose gate is coupled to the electro-static discharge control terminal (GND_start), first electrode is coupled to the pull-up node (PU), and second electrode is coupled to a ground, wherein discharging static electricity accumulated at the pull-up node (PU) under the control of the level signal of the electro-static discharge control terminal (GND_start) comprises: applying a turn-on signal to the electro-static discharge control terminal (GND_start), so that the first electro-static discharge transistor (M14) is turned on and discharges the static electricity accumulated at the pull-up node (PU) through a ground terminal.

In an embodiment, the second electro-static discharge sub-circuit comprises a second electro-static discharge transistor (M12, M13), whose gate is coupled to the electro-static discharge control terminal (GND_start), first electrode is coupled to the pull-down node (PD1, PD2), and second electrode is coupled to a ground, wherein discharging static electricity accumulated at the pull-down node (PD1, PD2) under the control of the level signal of the electro-static discharge control terminal (GND_start) comprises: applying a turn-on signal to the electro-static discharge control terminal (GND_start), so that the second electro-static discharge transistor (M12, M13) is turned on and discharges the static electricity accumulated at the pull-down node (PD1, PD2) through the ground terminal.

In an embodiment, the third electro-static discharge sub-circuit comprises a third electro-static discharge transistor (M15), whose gate is coupled to the electro-static discharge control terminal (GND_start), first electrode is coupled to the output terminal, and second electrode is coupled to a ground, wherein discharging static electricity accumulated at the output terminal under the control of the level signal of the electro-static discharge control terminal (GND_start) comprises: applying a turn-on signal to the electro-static discharge control terminal (GND_start), so that the third electro-static discharge transistor (M15) is turned on and discharges the static electricity accumulated at the output terminal through the ground terminal.

According to another aspect of the present disclosure, there is proposed a gate driving circuit applying the shift register unit as described above, comprising N stages of shift register units coupled in cascades, wherein the shift register unit is the shift register unit according to one of claims 1 to 11, wherein an input terminal of an i-th stage of shift register unit is coupled to an output terminal of an (i−1)-th stage of shift register unit, and an output terminal of the i-th stage of shift register unit is coupled to a reset terminal of the (i−1)-th stage of shift register unit, where N is an integer greater than 2, 1<i≤N; an input terminal of a first stage of shift register unit is coupled to a frame input signal control terminal; a reset terminal of an N-th stage of shift register unit is coupled to a frame reset signal control terminal.

According to another aspect of the present disclosure, there is proposed a display apparatus comprising the gate driving circuit as described above.

According to another aspect of the present disclosure, there is proposed a control method applicable to the display apparatus a described above, comprising: applying a turn-on signal at the electro-static discharge control terminal (GND_start) in response to a shut-down signal of the display apparatus; and discharging, by the first electro-static discharge sub-circuit, the static electricity accumulated at the pull-up node (PU) in response to the turn-on signal at the electro-static discharge control terminal (GND_start).

In an embodiment, the control method further comprises: discharging, by the second electro-static discharge sub-circuit, the static electricity accumulated at the pull-down node (PD1, PD2) in response to the turn-on signal at the electro-static discharge control terminal (GND_start).

In an embodiment, the control method further comprises: discharging, by the third electro-static discharge sub-circuit, the static electricity accumulated at the output terminal in response to the turn-on signal at the electro-static discharge control terminal (GND_start).

By utilizing the shift register unit, the gate driving circuit and the driving method provided in the present disclosure, it is capable of discharging static electricity accumulated inside the shift register unit effectively, and preventing characteristics of electric devices inside the shift register unit from being changed due to accumulated static electricity.

BRIEF DESCRIPTION OF THE DRAWINGS

In order to describe technical solutions of embodiments of the present disclosure more clearly, accompanying figures that need to be used in description of the embodiments of the present disclosure will be introduced briefly. Obviously, the accompanying figures described below are just some embodiments of the present disclosure. For those ordinary skilled in the art, other accompanying figures can be obtained from these figures without paying any inventive labor. The following figures are not scaled and drawn purposely according to the actual dimensions, because the key point is to show the substance and spirit of the present disclosure.

DETAILED DESCRIPTION

Technical solutions in embodiments of the present disclosure will be described below clearly and completely by combining with accompanying figures. Obviously, the embodiments described below are just a part of embodiments of the present disclosure, but not all the embodiments. Based on the embodiments of the present disclosure, all the other embodiments obtained by those ordinary skilled in the art without paying any inventive labor also fall into the scope sought for protection in the present disclosure.

"First", "second" and similar words used in the present disclosure do not indicate any sequence, quantity or importance, but they are just used to distinguish different components. Also, "include", "comprise" and similar words mean that an element or an object appearing prior to the word contains an element or an object or its equivalent listed subsequent to the word, but does not exclude other elements or objects. "Connect", "coupled to" and other similar words are not limited to physical or mechanical connection, but can comprise electrical connection, regardless of direct connection or indirect connection. "Up", "down", "left". "right" and so on are used to only indicate a relative position relationship. After an absolute position of a described object is changed, the relative position relationship is likely to be changed correspondingly.

Transistors adopted in all the embodiments of the present disclosure can be thin film transistors or field effect transistors or other devices having the same characteristics. In the present embodiment, connection manners of a drain and a source of each transistor can be exchanged with each other. Therefore, drains and sources of respective transistors in the embodiment of the present disclosure do not make any distinction. Herein, in order to distinct the two electrodes other than the gate of the transistor, one electrode is called as a drain, and another electrode is called as a source. Thin film transistors adopted in the embodiment of the present disclosure may be N-type transistors, or may be P-type transistors. In the embodiment of the present disclosure, when the N-type thin film transistor is adopted, its first electrode can be a source, and second electrode can be a drain. In the following embodiments, by taking the thin film transistor being the N-type transistor as an example, when the signal of the gate is a high level, the thin film transistor is turned on. It can be conceived that when the P-type transistor is adopted, it needs to adjust timings of drive signals correspondingly, for example, when a gate signal is a low level, the thin film transistor is turned on. Specific details are not described herein, but they shall be deemed as falling into the protection scope of the present disclosure.

Figure 1:
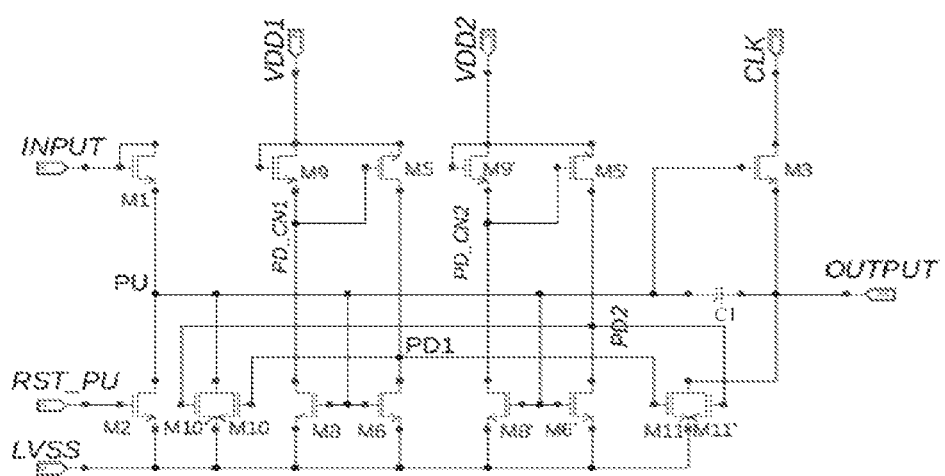
FIG. 1 is an exemplary circuit structure of a shift register unit according to the prior art.

FIG. 1 is an exemplary circuit structure of a shift register unit according to the prior art. According to the circuit structure as shown in FIG. 1, the shift register unit is applied an input signal via an input signal terminal INPUT, and charges an output capacitor C1, and pulls up a level of the pull-up node PU. After that, a clock signal is applied via a clock signal terminal CLK. Since the level of the pull-up node PU is high and an output transistor M3 is controlled to be turned on, the output terminal can output an output signal under the control of the clock signal input by the CLK. When the pull-up node PU is pulled up to the high level, a transistor M6/M6' is turned on under the control of the level signal of the pull-up node PU. A second power supply terminal LVSS is input a low level at this time, and thereby the pull-down node PD1/PD2 is pulled down to a low level. For example, by designing a channel width-to-length ratio of a transistor M8/M8' and a transistor M9/M9', a gate of a transistor M5/M5' is a low level when the pull-up node PU is a high level and controls the transistor M8/M8' and a transistor M6/M6' to be turned on. Therefore, the transistor M5/M5' is turned off, so that the pull-down PD1/PD2 is pulled down to the low level via the transistor M6/M6'. When the pull-up node PU is pulled down to the low level, the transistor M6/M6' and the transistor M8/M8' are turned off under the control of the level signal of the node PU, so that the pull-down node PD1/PD2 is pulled up to the high level under the control of a voltage VDD1/VDD2, and a transistor M10/M10' and a transistor M11/M11' are controlled to be turned on, thus further maintaining the pull-up node PU at the low level. After the output terminal outputs an output signal, a reset signal is applied via a reset control terminal RST_PU, to reset the pull-up node PU.

In the shift register unit as shown in FIG. 1, the transistor M5/M5', the transistors M6/M6', the transistors M8/M8', the transistors M9/M9', the transistors M10/M10', the transistors M11/M11', and a power supply terminals VDD1/VDD2 form two sets of circuit structures having the same structure. In the driving process of the shift register unit, the signal terminals VDD1/VDD2 is applied alternatively a driving signal (such as a high level), that is, when the VDD1 is input the high level, the VDD2 is input the low level; when the VDD1 is input the low level, the VDD2 is input the high level. Through the above control method, it makes that the above two sets of same circuits realize alternatively the same circuit control function, so as to prevent offset of electrical characteristics from the transistors (such as M5/M5'. M9/M9') in the shift register unit due to being in an operation state constantly.

According to the existing gate driving circuit applying the shift register unit, an output terminal OUTPUT of a first stage of shift register unit is coupled to the input signal terminal Input of a second stage of shift register unit, and an output terminal OUTPUT of a last stage of shift register unit is coupled to a reset terminal RESET of a second stage from the last of shift register unit. Except the first stage of shift register unit, an output terminal OUTPUT of each stage of shift register unit is further coupled to a reset terminal RESET of a previous stage of shift register unit. Except the last stage of shift register unit, an output terminal OUTPUT of each stage of shift register unit is further coupled to an input signal terminal Input of a next stage of shift register unit, that is, for an N-th stage of shift register unit, its input signal terminal Input is coupled to an output terminal OUTPUT of a (N−1)-th stage of shift register unit, a reset terminal RESET thereof is coupled to an output terminal OUTPUT of an (N+1)-th stage of shift register unit. A clock signal terminal CLK of the N-th stage of shift register unit is coupled to a first clock signal terminal CLK1, and a clock signal terminal CLK of a (N+1)-th stage of shift register unit is coupled to a second clock signal terminal CLK2, wherein the first clock signal CLK1 and the second clock signal CLK2 are complementary to each other, i.e., having a phase difference of 180 degrees and opposite levels. In addition, the first stage of shift register unit is coupled to a frame input signal control terminal, and the last stage of shift register unit is coupled to a frame reset signal control terminal.

Figure 2:
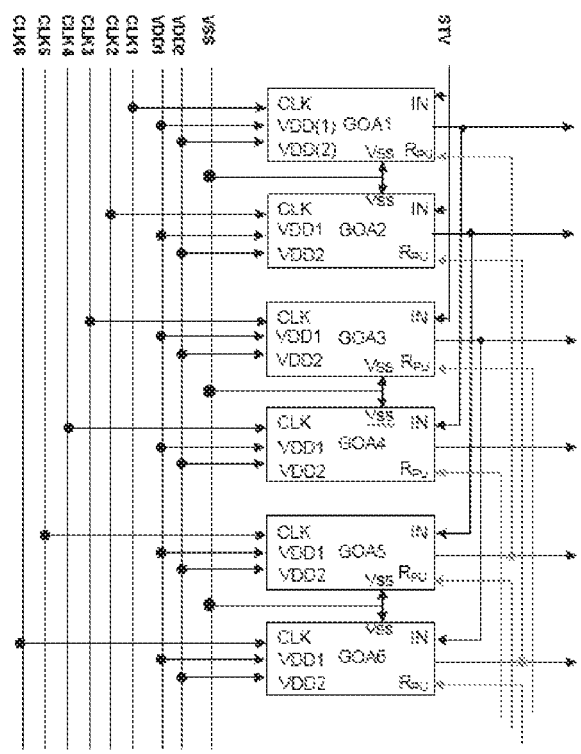
FIG. 2 is a gate driving circuit applying a shift register unit according to the prior art.

In the existing gate driving circuit described above, each stage of shift register unit can be a shift register unit group, and each shift register unit group comprises one or more shift register units, for example, a gate driving circuit applying a shift register unit according to the prior art as shown in FIG. 2. Herein, each stage of shift register unit group comprises 3 shift register units. Herein, except a first stage of shift register unit group, an output terminal OUTPUT of each shift register unit in each stage of shift register unit group is further coupled to a reset terminal RESET of one corresponding shift register unit in a previous stage of shift register unit group. Except a last stage of shift register unit group, the output terminal OUTPUT of each shift register unit in each stage of shift register unit group is further coupled to an input signal terminal Input of one corresponding shift register unit in a next stage of shift register unit group. In addition, each shift register unit in the first stage of shift register unit is coupled to a frame input signal control terminal, and each shift register unit in a last stage of shift register unit group is coupled to a frame reset signal control terminal.

The above describes an exemplary structure of the gate driving circuit applying the shift register unit. According to the actual situation, those skilled in the art can adopt other connection manners to involve the gate driving circuit.

FIG. 2 shows a schematic block diagram of a gate driving circuit according to the prior art. As shown in FIG. 2, clock signal terminals CLK of three shift register units in the first stage of shift register unit group are coupled to the first clock signal terminal CLK1, the second clock signal terminal CLK2, and the third clock signal terminal CLK3, respectively, and clock signal terminals CLK of three shift register units in the second stage of shift register unit group are coupled to a fourth clock signal terminal CLK4, a fifth clock signal terminal CLK5, and a sixth clock signal terminal CLK6. Herein, CLK1 and CLK4 are complementary to each other, CLK2 and CLK5 are complementary to each other, and CLK3 and CLK6 are complementary to each other.

Figure 3:
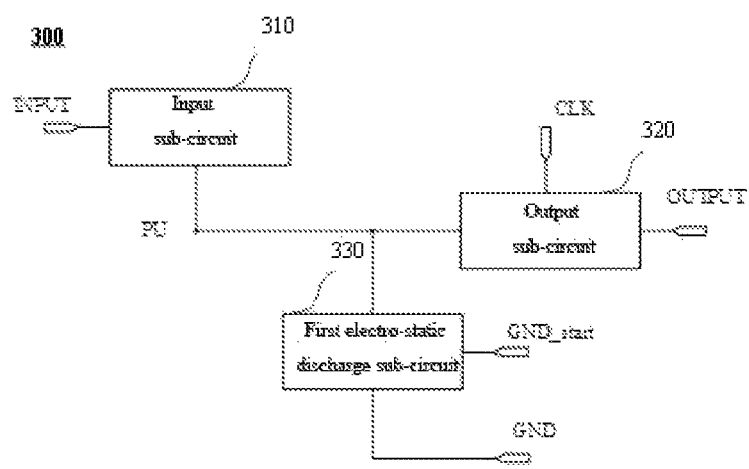
FIG. 3 is a schematic block diagram of a shift register unit according to some embodiments of the present disclosure.

FIG. 3 is a schematic block diagram of a shift register unit according to an embodiment of the present disclosure. As shown in FIG. 3, the shift register unit 300 can comprise: an input sub-circuit 310, whose first terminal is coupled to an input signal terminal INPUT, second terminal is coupled to a pull-up node PU; an output sub-circuit 320, whose first terminal is coupled to the pull-up node PU, second terminal is coupled to a clock signal terminal CLK, and third terminal is coupled to an output terminal OUTPUT, and configured to output a clock signal of the clock signal terminal CLK to the output terminal under the control of the level signal of the pull-up node PU; a first electro-static discharge sub-circuit 330, whose first terminal is coupled to the pull-up node PU, second terminal is coupled to an electro-static discharge control terminal GND_start, and third terminal is coupled to a ground. For example, the third terminal of the first electro-static discharge sub-circuit 330 can be coupled to a ground wire GND, wherein the ground wire GND can be coupled to for example a chassis housing, so as to realize the grounding effect. The first electro-static discharge sub-circuit 330 is configured to discharge static electricity accumulated at the pull-up node PU under the control of the level signal of the electro-static discharge control terminal GND_start.

By utilizing the shift register unit provided in the present disclosure, nodes inside the shift register unit can be discharged, so as to improve use properties of transistors inside the shift register unit.

Figure 4:
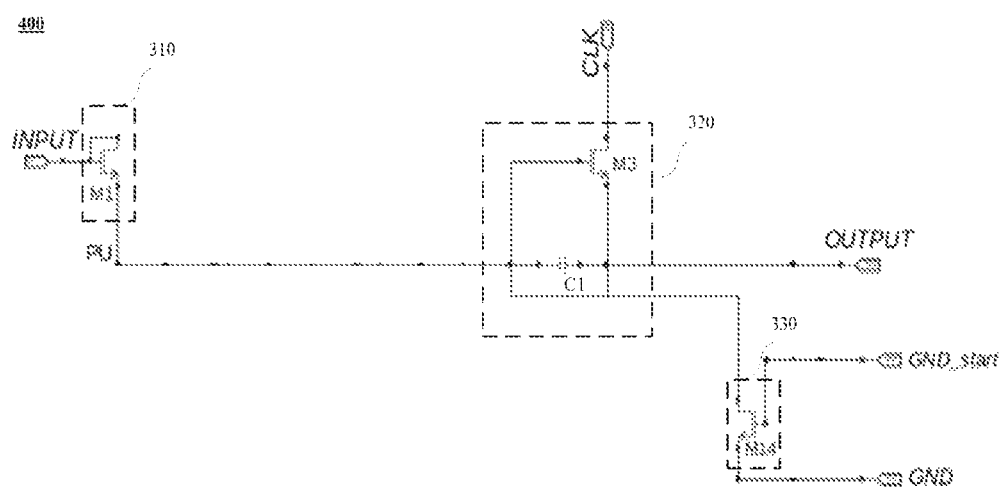
FIG. 4 is an exemplary circuit structure of a shift register unit according to some embodiments of the present disclosure.

FIG. 4 is an exemplary circuit structure of a shift register unit according to an embodiment of the present disclosure. The circuit structure of the shift register unit will be described in detail below by combining with FIGS. 3 and 4.

As shown in FIG. 4, in an embodiment, the output sub-circuit 310 can comprise an input transistor M1, wherein a gate of the input transistor M1 is coupled with a first electrode and coupled to the input terminal INPUT; the output sub-circuit 320 can comprise an output transistor M3 and an output capacitor C1, wherein a gate of the output transistor M3 is coupled with a first terminal of the output capacitor C1 and coupled to the pull-up node PU, a second electrode thereof is coupled with a second terminal of the output capacitor C1 and coupled to an output terminal Output_N, and a first electrode thereof is coupled to the clock signal terminal CLK. The first electro-static discharge sub-circuit 330 can comprise a first electro-static discharge transistor M14. Herein, a gate of the first electro-static discharge transistor M14 is coupled to the electro-static discharge control terminal GND_start, a first electrode thereof is coupled to the pull-up node PU, and a second electrode thereof is coupled to a ground. Herein, discharging static electricity accumulated at the pull-up node (PU) under the control of the level signal of the electro-static discharge control terminal GND_start can comprise: applying a turn-on signal to the electro-static discharge control terminal GND_start, such that the first electro-static discharge transistor M14 is turned on, and discharging static electricity accumulated at the pull-up node PU through a grounding terminal. For example, when the first electro-static discharge transistor M14 is an N-type transistor, the turn-on signal is a high level signal; when the first electro-static discharge transistor M14 is a P-type transistor, the turn-on signal is a low level signal.

When the electro-static discharge control terminal GND_start is input a turn-on signal, the shift register unit 400 according to the present disclosure controls the first electro-static discharge transistor M14 to be turned on, the pull-up node PU can be coupled to the ground, the static electricity accumulated at the pull-up node PU can be discharged through a ground terminal.

Figure 5:
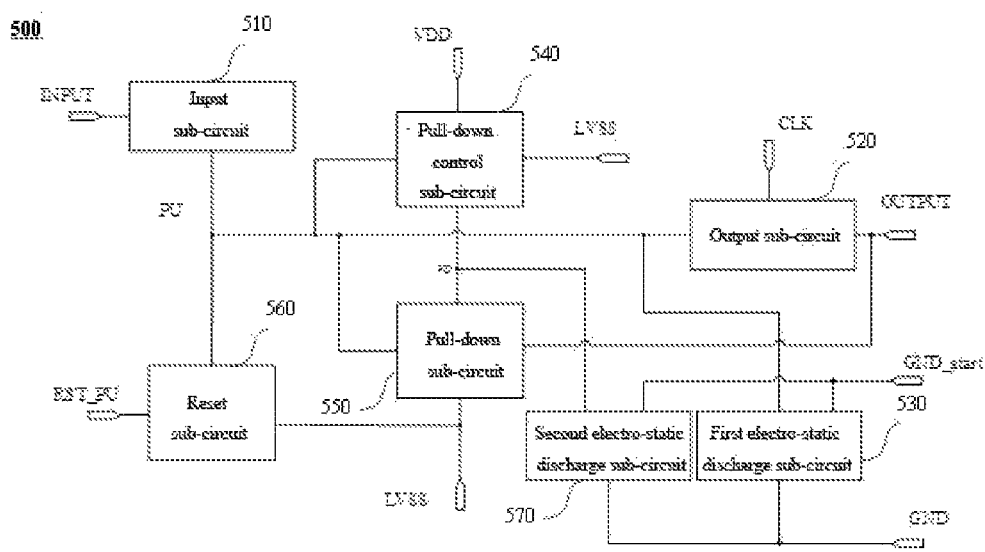
FIG. 5 is a schematic block diagram of a shift register unit according to some embodiments of the present disclosure.

FIG. 5 shows a schematic block diagram of a shift register unit according to an embodiment of the present disclosure. An input sub-circuit 510, an output sub-circuit 520, and a first electro-static discharge sub-circuit 530 as shown in FIG. 5 have the same structure as the input sub-circuit 310, the output sub-circuit 320, and a first electro-static discharge sub-circuit 330 as shown in FIG. 3, and thus no further details are provided herein.

As shown in FIG. 5, the shift register unit 500 can further comprise: a pull-down control sub-circuit 540, whose first terminal is coupled to the pull-up node PU, second terminal is coupled to a first power supply terminal VDD, and third terminal is coupled to a second power supply terminal LVSS, and configured to control the level of the pull-down node PD according to a level of the pull-up node PU, a first power supply signal input by the first power supply terminal VDD and a second power supply signal input by the second power supply terminal LVSS. In some embodiments, the first power supply terminal VDD can be input a first power supply signal at a high level, and the second power supply terminal LVSS can be input a second power supply signal at a low level.

The shift register unit 500 can further comprise: a pull-down sub-circuit 500, whose first terminal is coupled to the pull-down node PD, second terminal is coupled to the pull-up node PU, and third terminal is coupled to the output terminal OUTPUT, and fourth terminal is coupled to the second power supply terminal LVSS, and configured to pull down levels of the pull-up node PU and the output terminal to the second power supply signal of the second power supply terminal LVSS under the control of the level signal of the pull-down node PD.

The shift register unit 500 can further comprise: a reset sub-circuit 560, whose first terminal is coupled to a reset signal terminal RST_PU, second terminal is coupled to the pull-up node PU, and third terminal is coupled to the second power supply terminal LVSS, and configured to pull-down the pull-up node PU to the second power supply signal of the second power supply terminal LVSS under the control of the level signal of the reset signal terminal.

The shift register nit 500 can further comprise: a second electro-static discharge sub-circuit 570, whose first terminal is coupled to the pull-down node PD, second terminal is coupled to the electro-static discharge control terminal GND_start, and third terminal is coupled to a ground. For example, the third terminal of the second electro-static discharge sub-circuit 570 can be coupled to a ground wire GND, wherein the ground wire GND can be coupled to a case housing. And the second electro-static discharge sub-circuit 570 is configured to discharge static electricity accumulated at the pull-down node PD under the control of the level signal of the electro-static discharge control terminal GND_start.

Figure 6:
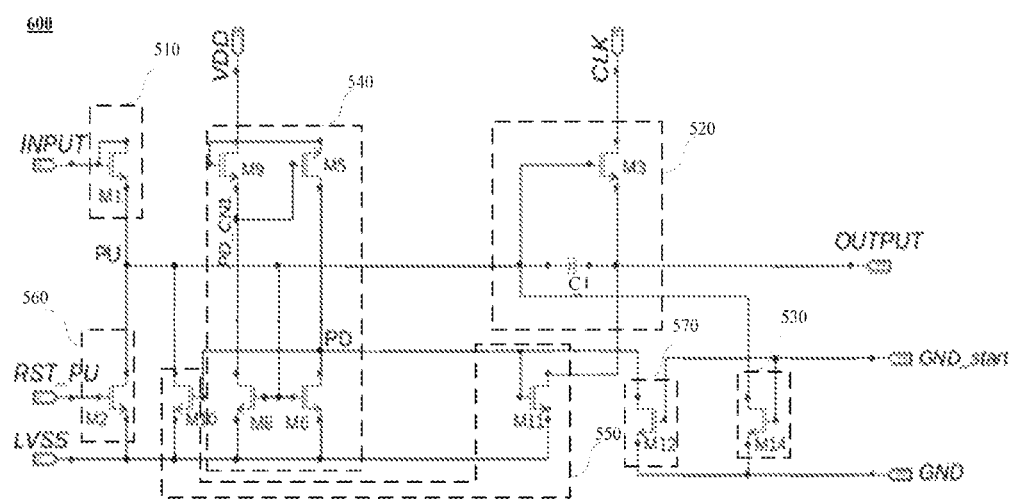
FIG. 6 is an exemplary circuit structure of a shift register unit according to some embodiments of the present disclosure.

FIG. 6 shows an exemplary circuit structure of a shift register unit according to an embodiment of the present disclosure. The circuit structure of the shift register unit will be described in detail by combining with FIGS. 5 and 6. Herein, the input sub-circuit 510, the output sub-circuit 520, and the first electro-static discharge sub-circuit 530 have the same structure as the output sub-circuit 310, the output sub-circuit 320, and the first electro-static discharge sub-circuit 330 as shown in FIG. 3, and thus no further details are given herein.

As shown in FIG. 6, in an embodiment, the pull-down control sub-circuit 540 can comprise a first pull-down control transistor M9, a second pull-down control transistor M5, a third pull-down control transistor M8, and a fourth pull-down control transistor M6, wherein a gate of the first pull-down control transistor M9 is coupled with a first electrode and coupled to a third power supply terminal VDD, and a second electrode thereof is coupled to a gate of the second pull-down control transistor M5 and coupled to a first electrode of the third pull-down control transistor M8; a first electrode of the second pull-down control transistor M5 is coupled to the first power supply terminal VDD, and a second electrode thereof is coupled to the pull-down node PD; a gate of the third pull-down control transistor M8 is coupled to the pull-up node PU, and a second electrode thereof is coupled to the second power supply terminal LVSS; a gate of the fourth pull-down control transistor M6 is coupled to the pull-up node PU, a first electrode thereof is coupled to the pull-down node PD, and a second electrode is coupled to the second power supply terminal LVSS.

In an embodiment, the pull-down sub-circuit 550 can comprise a first pull-down transistor M10 and a second pull-down transistor M11, wherein a gate of the first pull-down transistor M10 is coupled to the pull-down node PD, a first electrode thereof is coupled to the output terminal, and a second electrode thereof is coupled to the second power supply terminal LVSS; a gate of the second pull-down transistor M11 is coupled to the pull-down node PD, a first electrode thereof is coupled to the pull-up node PU, and a second electrode thereof is coupled to the second power supply terminal LVSS.

In an embodiment, the reset sub-circuit 560 can comprise a reset transistor M2, wherein a gate of the reset transistor M2 is coupled to the reset signal terminal, a first electrode thereof is coupled to the pull-up node PU, and a second electrode thereof is coupled to the second power supply terminal LVSS.

In an embodiment, the second electro-static discharge sub-circuit 570 can comprise a second electro-static discharge transistor M12, whose gate is coupled to the electro-static discharge control terminal GND_start, first electrode is coupled to the pull-down node PD, and second electrode is coupled to a ground. Herein, discharging static electricity accumulated at the pull-down node PD under the control of the level signal of the electro-static discharge control terminal GND_start can comprise applying a turn-on signal to the electro-static discharge control terminal GND_start, so that the second electro-static discharge transistor M12 is turned on and discharges static electricity accumulated at the pull-down node PD through the ground terminal.

When a turn-on signal is input to the electro-static discharge control terminal GND_start, a shift register unit 600 according to the present disclosure controls the second electro-static discharge transistor M12 to be turned on, the pull-down node PD can coupled to a ground, and the static electricity accumulated at pull-down node PD can be discharged through the ground terminal.

Although it is not shown in the figure, according to the principle of the present disclosure, it is easy for those skilled in the art to think of making various modifications of the shift register unit 600 described in the present disclosure. For example, the first electro-static discharge sub-circuit 530 can be omitted according to the shift register unit 500 or the shift register unit 600 according to the present disclosure.

Figure 7:
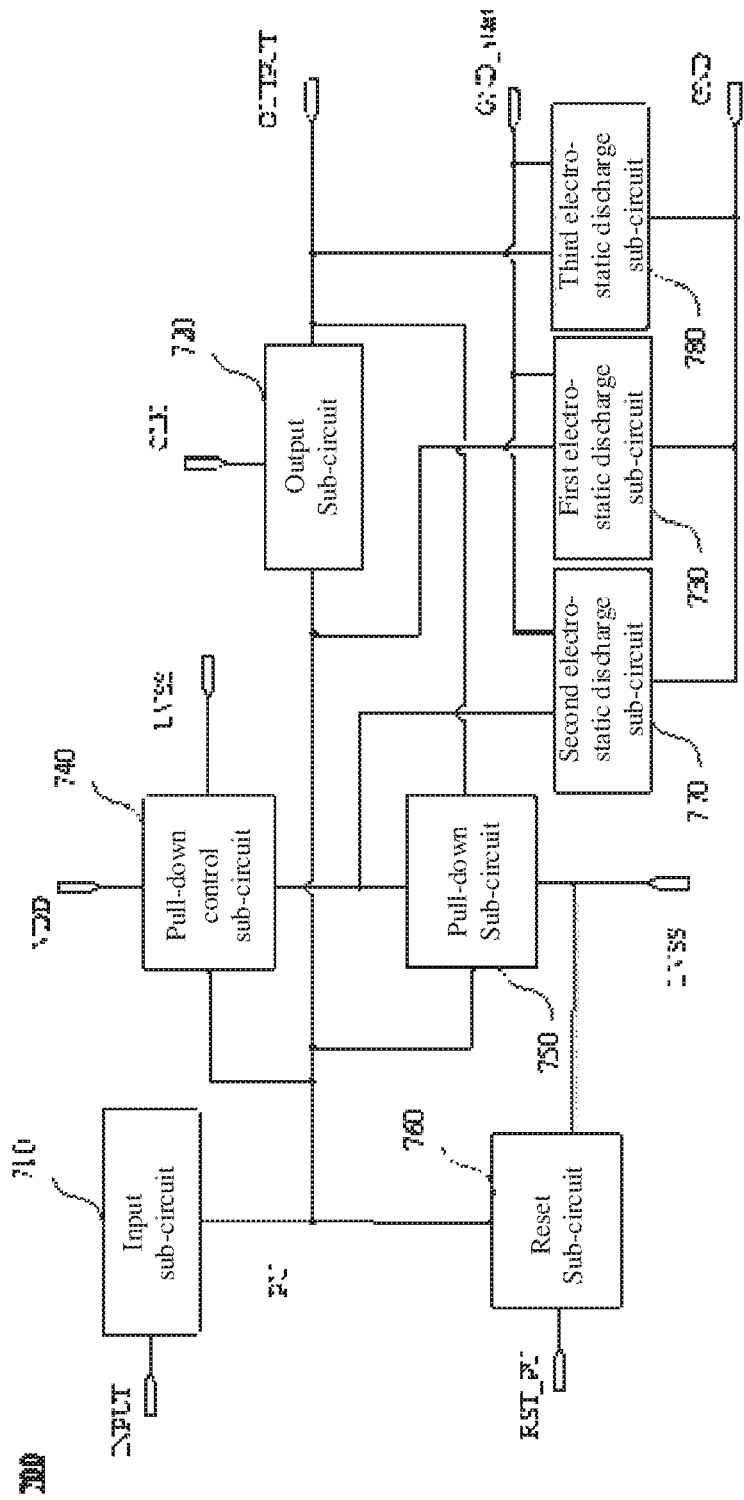
FIG. 7 is a schematic block diagram of a shift register unit according to some embodiments of the present disclosure.

FIG. 7 shows a schematic block diagram of a shift register unit according to an embodiment of the present disclosure. An input sub-circuit 710, an output sub-circuit 720, a first electro-static discharge sub-circuit 730, a pull-down control sub-circuit 740, a pull-down sub-circuit 750, a reset sub-circuit 760 and a second electro-static discharge sub-circuit 770 as shown in FIG. 7 have the same structure as the input sub-circuit 510, the output sub-circuit 520, the first electro-static discharge sub-circuit 530, the pull-down control sub-circuit 540, the pull-down sub-circuit 560, and the second electro-static discharge sub-circuit 570 as shown in FIG. 5, and thus no further details are further given herein.

As shown in FIG. 7, the shift register unit 700 can further comprise a third electro-static discharge sub-circuit 780, whose first terminal is coupled to the output terminal, second terminal is coupled to the electro-static discharge control terminal (GND_start), and third terminal is coupled to a ground. For example, the third terminal of the third electro-static discharge sub-circuit 780 can be coupled to a ground wire GND, wherein the ground wire GND can be coupled to the case housing. Furthermore, the third electro-static discharge sub-circuit 780 is configured to discharge the static electricity accumulated at the output terminal under the control of the level signal of the electro-static discharge control terminal (GND_start).

Figure 8:
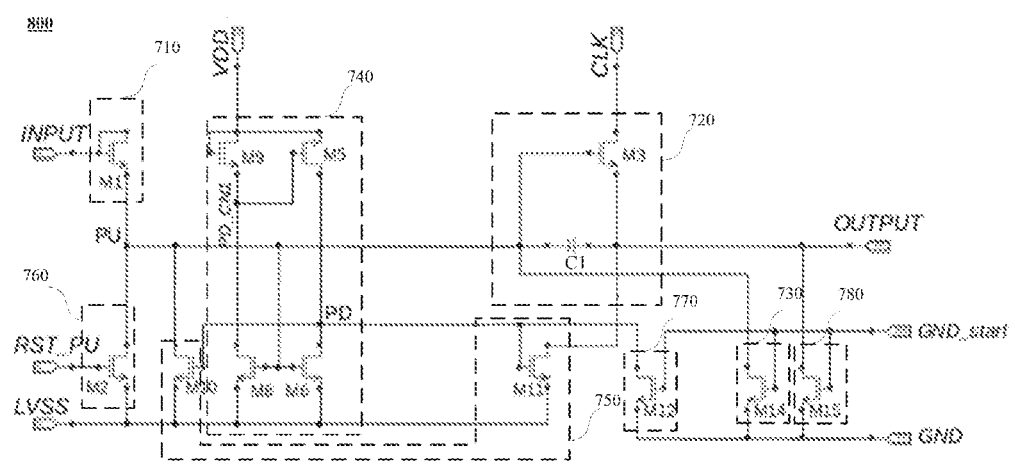
FIG. 8 is an exemplary circuit structure of a shift register unit according to some embodiments of the present disclosure.

FIG. 8 illustrates an exemplary circuit structure of a shift register unit according to an embodiment of the present disclosure. The circuit structure of the shift register unit will be described below in detail by combing with FIGS. 7 and 8. Herein, the input sub-circuit 710, the output sub-circuit 720, the first electro-static discharge sub-circuit 730, the pull-down control sub-circuit 740, the pull-down sub-circuit 750, the reset sub-circuit 760, and the second electro-static discharge sub-circuit 770 have the same structure as the input sub-circuit 510, the output sub-circuit 520, the first electro-static discharge sub-circuit 530, the pull-down control sub-circuit 540, the pull-down sub-circuit 550, the reset sub-circuit 560, and second electro-static discharge sub-circuit 570 as shown in FIG. 6, and thus no further details are given herein.

In an embodiment, the third electro-static discharge sub-circuit 780 can comprise the third electro-static discharge transistor M15, whose gate is coupled to the electro-static discharge control terminal GND_start, first electrode is coupled to the output terminal, and second electrode is coupled to a ground. Discharging static electricity accumulated at the output terminal under the control of the level signal of the electro-static discharge control terminal GND_start can comprise: applying the turn-on signal to the electro-static discharge control terminal GND_start, so that the third electro-static discharge transistor M15 is turned on and discharges the static electricity accumulated at the output terminal through the ground terminal.

When the electro-static discharge control terminal GND_start is input the turn-on signal, a shift register unit 800 according to the present disclosure controls the third electro-static discharge transistor M15 to be turned on, the output terminal OUTOUT can be coupled to the ground, and the static electricity accumulated at the output terminal OUTPUT can be discharged through the ground terminal.

In addition, although it is not shown in the figure, according to the principle of the present disclosure, it is easy for those skilled in the art to think of various modifications based on the shift register unit 700 or the shift register unit 800 described in the present disclosure. For example, in one modification, the second electro-static discharge sub-circuit, the pull-down control sub-circuit and the pull-down sub-circuit can be omitted in the shift register unit 700/800 according to the present disclosure. In the further modification, in case that the second electro-static discharge sub-circuit, the pull-down control sub-circuit and the pull-down sub-circuit in the shift register unit 700 or the shift register unit 800 of the present disclosure are omitted, the first electro-static discharge sub-circuit can be omitted selectively. In another modification, in case that the pull-down control sub-circuit and the pull-down sub-circuit in the shift register unit 700 or the shift register unit 800 of the present disclosure are retained, the first electro-static discharge sub-circuit and/or the second electro-static discharge sub-circuit in the shift register unit 700/800 can be omitted selectively according to the present disclosure.

Figure 9:
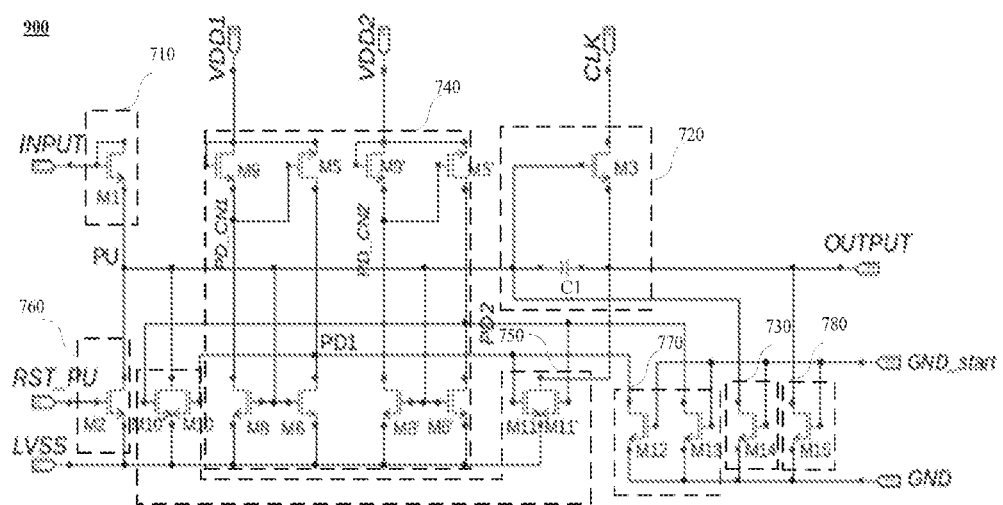
FIG. 9 is an exemplary circuit structure of a shift register unit according to some embodiments of the present disclosure.

FIG. 9 illustrates an exemplary circuit structure of a shift register unit according to an embodiment of the present disclosure. The circuit structure of the shift register unit will be described below in detail by combining with FIGS. 7, 8, and 9. Herein, the input sub-circuit 710, the output sub-circuit 720, the first electro-static discharge sub-circuit 730, the reset sub-circuit 760, and the third electro-static discharge sub-circuit 780 as shown in FIG. 9 have the same structure as those structures as shown in FIGS. 7 and 8, and thus no further details are given herein.

In an embodiment, in the shift register unit 900 as shown in FIG. 9, the pull-down control sub-circuit 740 can comprise two sub-units having the same structure, wherein a first pull-down control sub-circuit can comprise the first pull-down control transistor M9, the second pull-down control transistor M5, the third pull-down control transistor M8, the fourth pull-down control transistor M6, and a second pull-down control sub-circuit can comprise a first pull-down control transistor M9', a second pull-down control transistor M5', a third pull-down control transistor M8', and a fourth pull-down control transistor M6'.

Similarly, the pull-down sub-circuit 750 can comprise two sub-units having the same structure, wherein a first pull-down sub-circuit can comprise the first pull-down transistor M10 and the second pull-down transistor M11, and a second pull-down sub-circuit can comprise a first pull-down transistor M10' and a second pull-down transistor M11'.

As shown in FIG. 9, the first pull-down control sub-circuit and the first pull-down sub-unit are coupled with each other via a first pull-down node PD1, and the second pull-down control sub-circuit and the second pull-down sub-unit are coupled with each other via the second pull-down node PD2.

In an embodiment, in the shift register unit 900, the second electro-static discharge sub-circuit can comprise two sub-units having the same structure. For example, the second electro-static discharge sub-circuit can comprise second electro-static discharge transistors M12, and M13. Herein, a gate of the M12 is coupled to the electro-static discharge control terminal GND_start, a first electrode thereof is coupled to the first pull-down node PD1, and a second electrode thereof is coupled to the ground; a gate of M13 is coupled to the electro-static discharge control terminal GND_start, a first electrode thereof is coupled to the second pull-down node PD2, and a second electrode thereof is coupled to the ground.

In an embodiment, the second electro-static discharge sub-circuit is configured to discharge electric charges accumulated at the first pull-down node PD1 and the second pull-down node PD2 under the control of the level signal of the electro-static discharge control terminal GND_start. For example, when the electro-static discharge control terminal GND_start is input the turn-on signal, the transistors M12 and M13 are turned on, and the first pull-down node PD1 and the second pull-down node PD2 are coupled to the ground.

When the electro-static discharge control terminal GND_start is input the turn-on signal, the shift register unit 900 according to the present disclosure controls the second electro-static discharge transistors M12 and M13 to be turned on, the pull-down nodes PD1, and PD2 can be coupled to the ground, and the static electricity accumulated at the pull-down nodes PD1 and PD2 can be discharged through the ground terminal.

Figure 10:
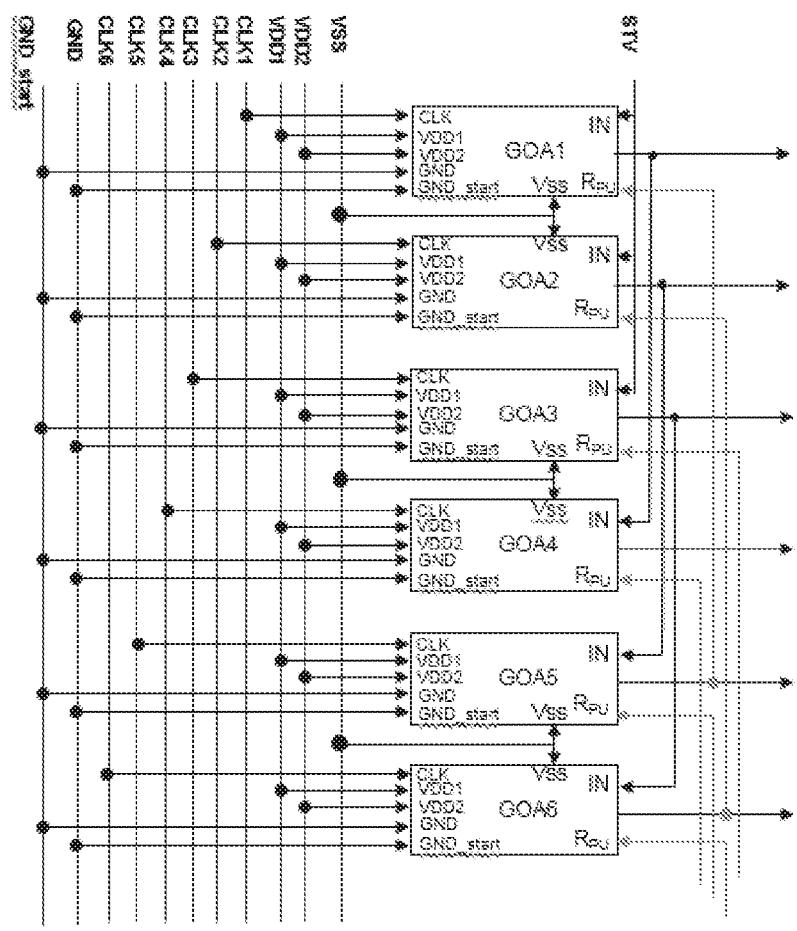
FIG. 10 is a gate driving circuit applying a shift register unit according to some embodiments of the present disclosure.

According to another aspect of the present disclosure, there is further provided a gate driving circuit. As shown in FIG. 10, the gate driving circuit can comprise a plurality of stages of shift register units coupled in cascades, wherein any stage or the plurality of stages of shift register units can adopt the structure of any one of the shift register units as described above. For example, all the plurality of stages of shift register units coupled in cascades in the gate driving circuit adopt the structure of the shift register unit as described above, or a part of the plurality of stages of shift register units coupled in cascades in the gate driving circuit can adopt the structure of the shift register unit as described above.

Herein, the cascade structure between the respective shift register units of the gate driving circuit as shown in FIG. 10 is the same as the cascade structure of the shift register unit of the gate driving circuit as shown in FIG. 2, and thus no further details are given herein. Those skilled in the art can understand that other cascade structures as described above can also be used according to the actual situation.

As shown in FIG. 10, the shift register unit applying the gate driving circuit according to the present disclosure is coupled to both the electro-static discharge control terminal GND_start and the ground wire GND.

According to another aspect, there is further provided a control method applicable to any one of the shift register units as described above.

Figure 11:
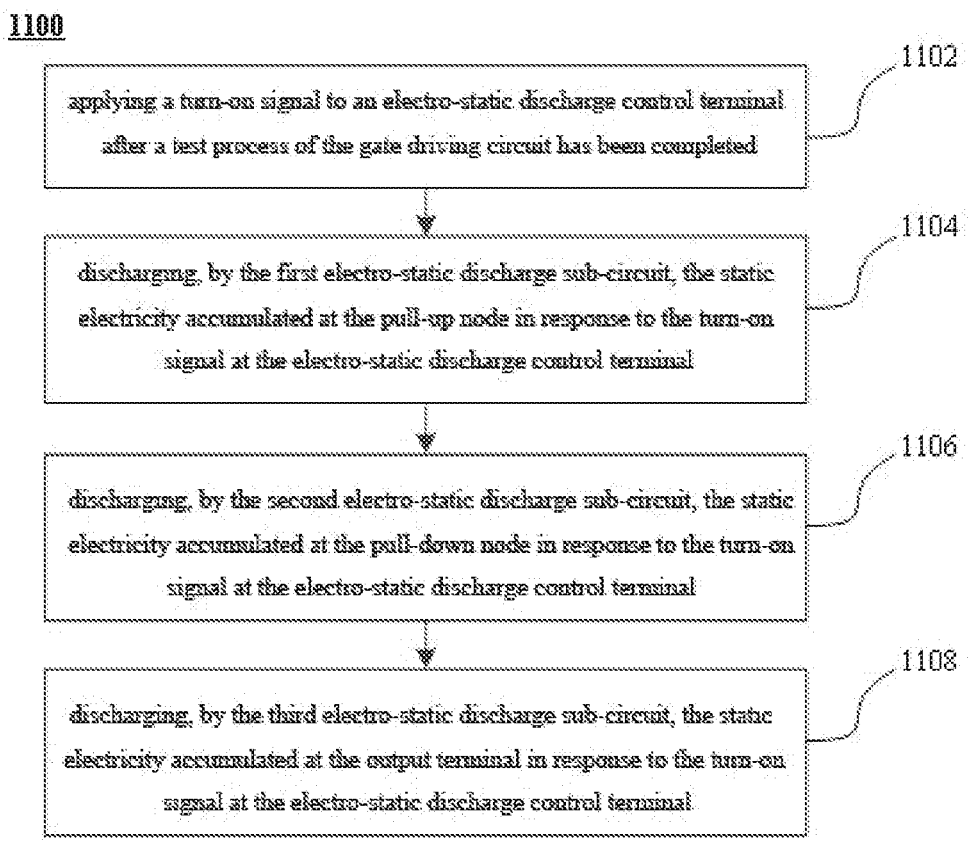
FIG. 11 is a flow chart of a control method of a gate driving circuit according to the present disclosure.

FIG. 11 is a flow chart of a control method of a gate driving circuit according to the present disclosure. As shown in FIG. 11, the control method of the gate driving circuit according to the present disclosure can comprise:

Step 1102: applying a turn-on signal to an electro-static discharge control terminal after a test process of the gate driving circuit has been completed;

Step 1104: discharging, by the first electro-static discharge sub-circuit, the static electricity accumulated at the pull-up node in response to the turn-on signal at the electro-static discharge control terminal;

Step 1106: discharging, by the second electro-static discharge sub-circuit, the static electricity accumulated at the pull-down node in response to the turn-on signal at the electro-static discharge control terminal;

Step 1108: discharging, by the third electro-static discharge sub-circuit, the static electricity accumulated at the output terminal in response to the turn-on signal at the electro-static discharge control terminal;

In step 1102, turn-on signal is applied the to the electro-static discharge control terminal after the test process of the gate driving circuit has been completed. For example, after the test process (such as Array Test. Cell Test) has been completed, the high level is applied to GND_start. Under the control of the level signal of the electro-static discharge control terminal, as described above, the pull-up node PU and/or the pull-down node PD/the output terminal OUTPUT is coupled to the ground through the first electro-static discharge circuit and/or the second electro-static discharge circuit and/or the third electro-static discharge circuit, to discharge electric charges accumulated inside the gate driving circuit unit, so as to prevent static electricity from being accumulated inside the gate driving circuit in the process of product manufacturing and handling.

In step 1104, the first electro-static discharge sub-circuit can comprise a first electro-static discharge transistor. Herein, a gate of the first electro-static discharge transistor is coupled to the electro-static discharge control terminal GND_start, a first electrode thereof is coupled to the pull-up node PU, and a second electrode thereof is coupled to the ground. Discharging, by the first electro-static discharge sub-circuit, static electricity accumulated at the pull-up node in response to the turn-on signal at the electro-static discharge control terminal can comprise: the first electro-static discharge transistor is turned on under the control the turn-on signal applied by the electro-static discharge control terminal GND-start and discharges the static electricity accumulated at the pull-up node PU at the ground terminal, for example, when the first electro-static discharge transistor is a N-type transistor, the turn-on signal is a high level, or when the first electro-static discharge transistor is a P-type transistor, the turn-on signal is a low level.

In step 1106, the second electro-static discharge sub-circuit can comprise a second electro-static discharge transistor, whose gate is coupled to the electro-static discharge control terminal GND_start, first electrode is coupled to the pull-down node PD, and second electrode is coupled to the ground. Discharging, by the second electro-static discharge sub-circuit, the static electricity accumulated at the pull-down node in response to the turn-on signal at the electro-static discharge control terminal can comprise: the second electro-static discharge transistor is turned on under the control of the turn-on signal applied by the electro-static discharge control terminal GND_start and the static electricity accumulated at the pull-down node PD is discharged through the ground terminal, for example, when the second electro-static discharge transistor is a N-type transistor, the turn-on signal is a high level, or when the first electro-static discharge transistor is a P-type transistor, the turn-on signal is a low level.

In step 1108, the third electro-static discharge sub-circuit can comprise a third electro-static discharge transistor, whose gate is coupled to the electro-static discharge control terminal GND_start, first electrode is coupled to the output terminal, and second electrode is coupled to the ground. Discharging, by the third electro-static discharge sub-circuit, the static electricity accumulated at the output terminal in response to the turn-on signal at the electro-static discharge control terminal can comprise: the third electro-static discharge transistor is turned on under the control of the turn-on signal applied by the electro-static discharge control terminal GND_start, and discharges the static electricity accumulated at the output terminal through the ground terminal, for example, when the third electro-static discharge transistor is a N-type transistor, the turn-on signal is a high level, or when the first electro-static discharge transistor is a P-type transistor, the turn-on signal is a low level.

FIG. 11 just shows a control method of a gate driving circuit according to an embodiment of the present disclosure. According to the principle of the present disclosure, it can be conceived that one or more of steps 1104, 1106, 1108 in the above flows can be omitted. For example, when the shift register unit does not comprise the first electro-static discharge sub-circuit, step 1104 can be omitted. For another example, when the shift register unit does not comprise the second electro-static discharge sub-circuit, step 1106 can be omitted. For another example, when the shift register unit does not comprise the third electro-static discharge sub-circuit, step 1108 can be omitted.

Figure 12:
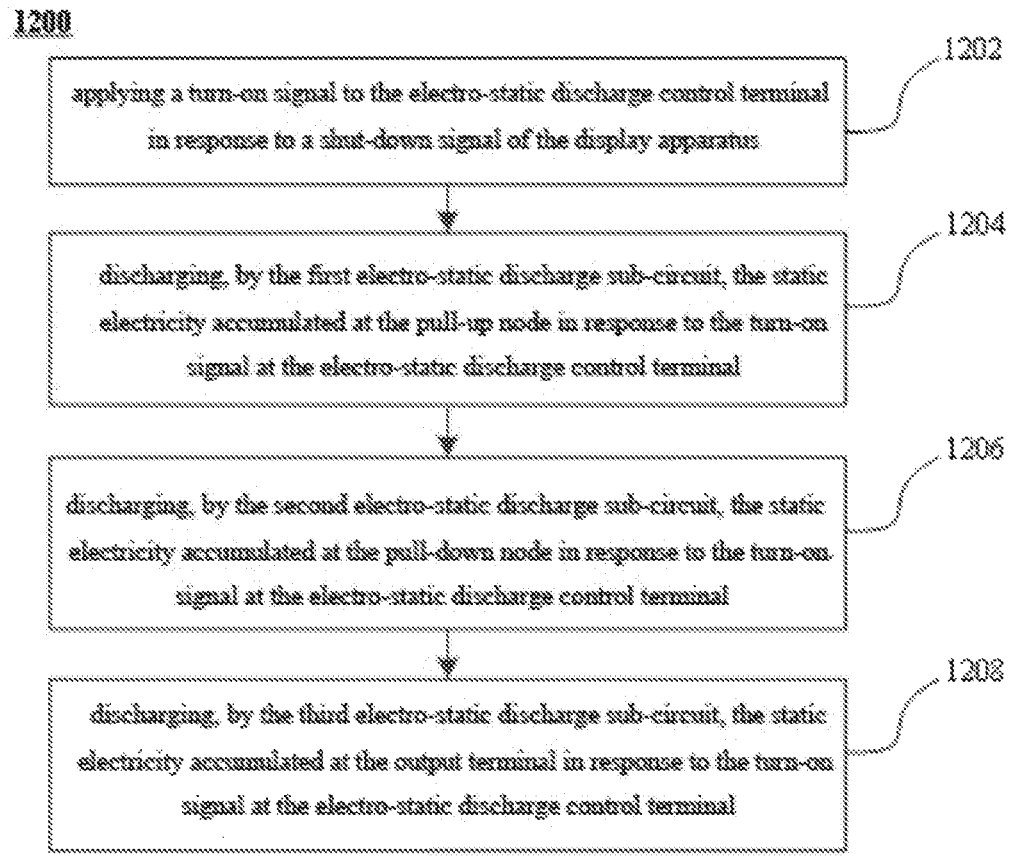
FIG. 12 is a flow chart of a control method of a display apparatus according to the present disclosure.

FIG. 12 is a flow chart of a control method of a display apparatus according to the present disclosure. Herein, the display apparatus can comprise any one of the shift register unit as described above. As shown in FIG. 12, the control method of the gate driving circuit according to the present disclosure can comprise;

Step 1202: applying a turn-on signal to the electro-static discharge control terminal in response to a shut-down signal of the display apparatus;

Step 1204: discharging, by the first electro-static discharge sub-circuit, the static electricity accumulated at the pull-up node in response to the turn-on signal at the electro-static discharge control terminal;

Step 1206: discharging, by the second electro-static discharge sub-circuit, the static electricity accumulated at the pull-down node in response to the turn-on signal at the electro-static discharge control terminal;

Step 1208: discharging, by the third electro-static discharge sub-circuit, the static electricity accumulated at the output terminal in response to the turn-on signal at the electro-static discharge control terminal.

In step 1202, in response to the shut-down signal (for example, when the user presses down the shut-down key) of the display apparatus, the turn-on signal is applied to the electro-static discharge control terminal GND_start, for example, the high level is applied to the GND-start. Under the control of the level signal of the electro-static discharge control terminal, as described above, the pull-up node PU and/or the pull-down node PD/the output terminal OUTPUT is coupled to the ground through the first electro-static discharge circuit and/or the second electro-static discharge circuit and/or the third electro-static discharge circuit, to discharge the electric charges accumulated inside the gate driving circuit unit, so as to present the static electricity from being accumulated inside the gate driving circuit in the process of using.

In the step 1204, the first electro-static discharge sub-circuit can comprise a first electro-static discharge transistor, wherein a gate of the electro-static discharge transistor is coupled to the electro-static discharge control terminal GND_start, a first electrode thereof is coupled to the pull-up node PU, and a second electrode thereof is coupled to the ground. Discharging, by the first electro-static discharge sub-circuit, the static electricity accumulated at the pull-up node in response to the turn-on signal at the electro-static discharge control terminal can comprise: the first electro-static discharge transistor is turned on under the control of the turn-on signal applied by the electro-static discharge control terminal GND_start, and discharges the static electricity accumulated at the pull-up node PU through the ground terminal, for example, when the first electro-static discharge transistor is an N-type transistor, the turn-on signal is a high level, or when the first electro-static discharge transistor is a P-type transistor, the turn-on signal is a low level.

In step 1206, the second electro-static discharge sub-circuit can comprise a second electro-static discharge transistor, whose gate is coupled to the electro-static discharge control terminal GND_start, first electrode is coupled to the pull-down node PD, and second electrode is coupled to the ground. Discharging, by the second electro-static discharge sub-circuit, the static electricity accumulated at the pull-down node in response to the turn-on signal at the electro-static discharge control terminal can comprise: the second electro-static discharge transistor is turned on under the control of the turn-on signal applied by the electro-static discharge control terminal GND_start, and discharges the static electricity accumulated at the pull-down nodePD through the ground terminal, for example, when the second electro-static discharge transistor is a N-type transistor, the turn-on signal is a high level, or when the first electro-static discharge transistor is a P-type transistor, the turn-on signal is a low level.

In step 1208, the third electro-static discharge sub-circuit can comprise a third electro-static discharge transistor, whose gate is coupled to the electro-static discharge control terminal GND_start, first electrode is coupled to the output terminal, and second electrode is coupled to the ground. Discharging, by the third electro-static discharge sub-circuit, the static electricity accumulated at the output terminal in response to the turn-on signal at the electro-static discharge control terminal can comprise: the third electro-static discharge transistor is turned on under the control of the turn-on signal applied by the electro-static discharge control terminal GND_start, and discharges the static electricity accumulated at the output terminal through the ground terminal, for example, when the third electro-static discharge transistor is a N-type transistor, the turn-on signal is a high level, or when the first electro-static discharge transistor is a P-type transistor, the turn-on signal is a low level.

FIG. 12 only shows an embodiment of a control method of a display apparatus according to the present disclosure. According to the principle of the present disclosure, it may be conceived that one or more of steps 1204, 1206, and 1208 in the above flow can be omitted. For example, when the shift register unit does not comprise the first electro-static discharge sub-circuit, step 1204 can be omitted. For another example, when the shift register unit does not comprise the second electro-static discharge, step 1206 can be omitted. For example, when the shift register nit does not comprise the third electro-static discharge, step 1208 can be omitted.

In another embodiment, in a standing process of the gate driving circuit according to the present disclosure, since the first electro-static discharge circuit, the second electro-static discharge circuit, and the third electro-static discharge circuit can be coupled to the chassis housing (such as module housing), static electricity existing inside the gate driving circuit unit can be released on the ground wire GND through coupling between capacitors, so that static electricity accumulated inside the gate driving circuit unit can be released as soon as possible.

Figure 13:
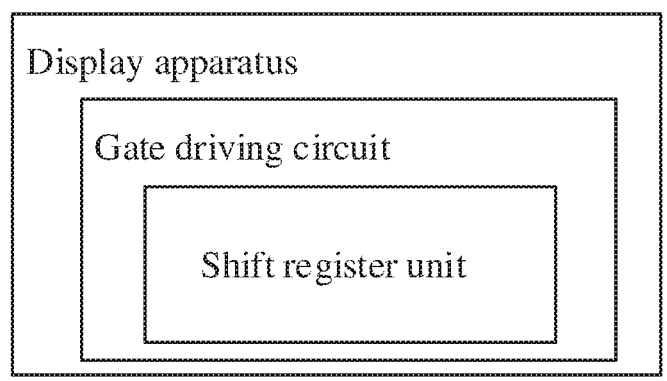
FIG. 13 shows an exemplary display apparatus according to an embodiment of the present disclosure.

According to another aspect of the present disclosure, there is provided a display apparatus comprising the gate driving circuit as described above. FIG. 13 shows an exemplary display apparatus according to an embodiment of the present disclosure.

As shown in FIG. 13, there is provided in the present embodiment a gate driving circuit, comprising the shift register unit as described above.

Correspondingly, there is further disclosed in the present embodiment a display apparatus, comprising the gate driving circuit. The display apparatus can be any product or means having the display function such as a mobile phone, a tablet computer, a television set, a display, a notebook computer, a digital framework, a navigator, etc.

Of course, the display apparatus of the present embodiment can further comprise other conversional structures, such as a power supply unit, a display driving unit, etc.

Unless otherwise defined, all the terms (including technical and scientific terms) used herein have same meaning commonly understood by those ordinary skilled in the art. It shall be understood that those terms defined in common dictionaries shall be explained as having meanings consistent with their meanings in the context of relative technology, but shall not be explained as idealized or very formal meanings, unclear explicitly defined herein.

The above are descriptions of the present disclosure, but shall not be deemed as limitations to the present disclosure. Although several exemplary embodiments of the present disclosure are described, it is easy for those skilled in the art to understand that many modifications and amendments can be made to exemplary embodiments without departing from teachings and advantages of the present disclosure. Therefore, all these amendments intend to be included within the scope of the present disclosure defined in the Claims. It shall be understood that the above are descriptions of the present disclosure but shall not be deemed as being limited to specific embodiments of the present disclosure. Furthermore, amendments made to the disclosed embodiments and other embodiments intend to be included within the scope of the attached Claims. The present disclosure is defined by the Claims and equivalents thereof.

What is claimed is:

1. A shift register unit, comprising:
an input sub-circuit, whose first terminal is coupled to an input signal terminal, and second terminal is coupled to a pull-up node;
an output sub-circuit, whose first terminal is coupled to the pull-up node, second terminal is coupled to a clock signal terminal, and third terminal is coupled to an output terminal, and configured to output a clock signal of the clock signal terminal to the output terminal under a control of a level signal of the pull-up node; and
a first electro-static discharge sub-circuit, whose first terminal is coupled to the pull-up node, second terminal is coupled to an electro-static discharge control terminal, and third terminal is coupled to a ground, and configured to discharge static electricity accumulated at the pull-up node under a control of a level signal of the electro-static discharge control terminal, wherein a turn-on signal is applied at the electro-static discharge control terminal in response to a shut-down signal of a display apparatus comprising the shift register unit.

2. The shift register unit according to claim 1, further comprising:
a pull-down control sub-circuit, whose first terminal is coupled to the pull-up node, second terminal is coupled to a first power supply terminal, and third terminal is coupled to a second power supply terminal, and configured to control a level of a pull-down node according to a level of the pull-up node, a first power supply signal input by the first power supply terminal and a second power supply signal input by the second power supply terminal;
a pull-down sub-circuit, whose first terminal is coupled to the pull-down node, second terminal is coupled to the pull-up node, third terminal is coupled to the output terminal, and fourth terminal is coupled to the second power supply terminal, and configured to pull down levels of the pull-up node and the output terminal to the second power supply signal under a control of a level signal of the pull-down node; and
a reset sub-circuit, whose first terminal is coupled to a reset signal terminal, second terminal is coupled to the pull-up node, and third terminal is coupled to the second power supply terminal, and configured to pull down the pull-up node to the second power supply signal under a control of a level signal of the reset signal terminal.

3. The shift register unit according to claim 2, further comprising:
a second electro-static discharge sub-circuit, whose first terminal is coupled to the pull-down node, second terminal is coupled to the electro-static discharge control terminal, and third terminal is coupled to the ground, and configured to discharge static electricity accumulated at the pull-down node under the control of the level signal of the electro-static discharge control terminal.

4. The shift register unit according to claim 1, further comprising:
a third electro-static discharge sub-circuit, whose first terminal is coupled to the output terminal, second terminal is coupled to the electro-static discharge control terminal, and third terminal is coupled to the ground, and configured to discharge static electricity accumulated at the output terminal under the control of the level signal of the electro-static discharge control terminal.

5. The shift register unit according to claim 1, wherein the first electro-static discharge sub-circuit comprises a first electro-static discharge transistor, whose gate is coupled to the electro-static discharge control terminal, first electrode is coupled to the pull-up node, and second electrode is coupled to the ground.

6. The shift register unit according to claim 5, wherein discharging static electricity accumulated at the pull-up node under the control of the level signal of the electro-static discharge control terminal comprises:
applying the turn-on signal to the electro-static discharge control terminal, so that the first electro-static discharge transistor is turned on and discharges the static electricity accumulated at the pull-up node through a ground terminal.

7. The shift register unit according to claim 3, wherein the second electro-static discharge sub-circuit comprises a second electro-static discharge transistor, whose gate is coupled to the electro-static discharge control terminal, first electrode is coupled to the pull-down node, and second electrode is coupled to the ground.

8. The shift register unit according to claim 7, wherein discharging static electricity accumulated at the pull-down node under the control of the level signal of the electro-static discharge control terminal comprises:
applying the turn-on signal to the electro-static discharge control terminal, so that the second electro-static discharge transistor is turned on and discharges the static electricity accumulated at the pull-down node through the ground.

9. The shift register unit according to claim 4, wherein the third electro-static discharge sub-circuit comprises a third electro-static discharge transistor, whose gate is coupled to the electro-static discharge control terminal, first electrode is coupled to the output terminal, and second electrode is coupled to the ground.

10. The shift register unit according to claim 9, wherein discharging static electricity accumulated at the output terminal under the control of the level signal of the electro-static discharge control terminal comprises: applying the turn-on signal to the electro-static discharge control terminal, so that the third electro-static discharge transistor is turned on and discharges the static electricity accumulated at the output terminal through the ground.

11. The shift register unit according to claim 1, wherein the input sub-circuit comprises an input transistor, wherein
a gate of the input transistor is coupled with a first electrode of the input transistor and coupled to the input signal terminal, and a second electrode of the input transistor is coupled to the pull-up node; and
the output sub-circuit comprises an output transistor and an output capacitor, wherein a gate of the output transistor is coupled with a first terminal of the output capacitor and coupled to the pull-up node, a first terminal of the output transistor is coupled with a second terminal of the output capacitor and coupled to the output terminal, and a second terminal of the output transistor is coupled to the clock signal terminal.

12. The shift register unit according to claim 2, wherein the pull-down control sub-circuit comprises a first pull-down control transistor, a second pull-down control transistor, a third pull-down control transistor, and a fourth pull-down control transistor, wherein
a gate of the first pull-down control transistor is coupled with a first electrode and coupled to a third power supply terminal, a second electrode of the first pull-down control transistor is coupled to a gate of the second pull-down control transistor and coupled to a first electrode of the third pull-down control transistor;
a first electrode of the second pull-down control transistor is coupled to the third power supply terminal, and a second electrode of the second pull-down control transistor is coupled to the pull-down node;
a gate of the third pull-down control transistor is coupled to the pull-up node, and a second electrode of the third pull-down control transistor is coupled to the second power supply terminal;
a gate of the fourth pull-down control transistor is coupled to the pull-up node, a first electrode of the fourth pull-down control transistor is coupled to the pull-down node, and second electrode of the fourth pull-down control transistor is coupled to the second power supply terminal;
the pull-down sub-circuit comprises a first pull-down transistor and a second pull-down transistor, wherein
a gate of the first pull-down transistor is coupled to the pull-down node, a first electrode of the first pull-down transistor is coupled to the output terminal, and a second electrode of the first pull-down transistor is coupled to the second power supply terminal;
a gate of the second pull-down transistor is coupled to the pull-down node, a first electrode of the second pull-down transistor is coupled to the pull-up node, and a second electrode of the second pull-down transistor is coupled to the second power supply terminal; and
the reset sub-circuit comprises a reset transistor, wherein a gate of the reset transistor is coupled to the reset signal terminal, a first electrode of the reset transistor coupled to the pull-up node, and a second electrode of the reset transistor is coupled to the second power supply terminal.

13. A gate driving circuit, comprising N stages of shift register units coupled in cascades, wherein each of the shift register units is the shift register unit according to claim 1, wherein
an input terminal of an i-th stage of shift register unit is coupled to an output terminal of an (i−1)-th stage of shift register unit, and an output terminal of the i-th stage of shift register unit is coupled to a reset terminal of the (i−1)-th stage of shift register unit, where N is an integer greater than 2, $1<i\leq N$;
an input terminal of a first stage of shift register unit is coupled to a frame input signal control terminal; and
a reset terminal of an N-th stage of shift register unit is coupled to a frame reset signal control terminal.

14. A display apparatus, comprising the gate driving circuit according to claim 13.

15. A control method applicable to the display apparatus according to claim 14, comprising:
- applying the turn-on signal at the electro-static discharge control terminal in response to the shut-down signal of the display apparatus; and
- discharging, by the first electro-static discharge sub-circuit, static electricity accumulated at the pull-up node in response to the turn-on signal at the electro-static discharge control terminal.

16. The control method according to claim 15, further comprising:
- discharging, by a second electro-static discharge sub-circuit, static electricity accumulated at a pull-down node in response to the turn-on signal at the electro-static discharge control terminal.

17. The control method according to claim 15, further comprising:
- discharging, by a third electro-static discharge sub-circuit, static electricity accumulated at an output terminal in response to the turn-on signal at the electro-static discharge control terminal.

\* \* \* \* \*